United States Patent
Knopik

(10) Patent No.: US 9,602,059 B2
(45) Date of Patent: Mar. 21, 2017

(54) AMPLIFIER TOPOLOGY FOR ENVELOPE TRACKING

(71) Applicant: Optis Circuit Technology, LLC, Plano, TX (US)

(72) Inventor: Vincent Knopik, St. Pierre d'Allevard (FR)

(73) Assignee: OPTIS CIRCUIT TECHNOLOGY, LLC, Plano, TX (US)

(*) Notice: Subject to any disclaimer, the term of this patent is extended or adjusted under 35 U.S.C. 154(b) by 0 days.

(21) Appl. No.: 14/769,126

(22) PCT Filed: Mar. 20, 2014

(86) PCT No.: PCT/EP2014/055581
§ 371 (c)(1),
(2) Date: Aug. 20, 2015

(87) PCT Pub. No.: WO2014/147167
PCT Pub. Date: Sep. 25, 2014

(65) Prior Publication Data
US 2016/0126901 A1    May 5, 2016

(30) Foreign Application Priority Data
Mar. 20, 2013   (EP) .................................. 13160179

(51) Int. Cl.
*H03F 1/22*    (2006.01)
*H03F 1/02*    (2006.01)
(Continued)

(52) U.S. Cl.
CPC .......... *H03F 1/0222* (2013.01); *H03F 1/0266* (2013.01); *H03F 1/223* (2013.01);
(Continued)

(58) Field of Classification Search
CPC .......... H03F 1/0222; H03F 1/22; H03F 1/223; H03F 1/226
(Continued)

(56) References Cited

U.S. PATENT DOCUMENTS

2009/0273399 A1   11/2009  Wang
2011/0070848 A1   3/2011   Ramachandra Reddy
(Continued)

FOREIGN PATENT DOCUMENTS

EP           1 526 636 A1    4/2005

OTHER PUBLICATIONS

International Search Report issued in corresponding International application No. PCT/EP2014/055581, date of completion of the International search Apr. 15, 2014.
(Continued)

*Primary Examiner* — Steven J Mottola
(74) *Attorney, Agent, or Firm* — The Danamraj Law Group, P.C.; Thomas L. Crisman; Kenneth A. McClure

(57) ABSTRACT

An amplifier has an input port for receiving an input signal and an envelope port for receiving an envelope signal indicative of an envelope of the input signal, and an output port for delivering an amplified signal. The amplifier has a first transistor and a second transistor. A first biasing circuit is coupled to the envelope port and is arranged to generate a first bias voltage dependent on the envelope signal. A summing stage is coupled to the input port for receiving the input signal, to the first biasing circuit for receiving the first bias voltage, and to the gate of the first transistor. A second biasing circuit is coupled between the envelope port and the gate of the second transistor, and is arranged to generate a second bias voltage dependent on the envelope signal.

17 Claims, 13 Drawing Sheets

(51) Int. Cl.
  *H03F 3/19*     (2006.01)
  *H03F 3/24*     (2006.01)
  *H03F 3/193*    (2006.01)
(52) U.S. Cl.
  CPC ............... *H03F 3/19* (2013.01); *H03F 3/193* (2013.01); *H03F 3/245* (2013.01); *H03F 2200/102* (2013.01); *H03F 2200/108* (2013.01); *H03F 2200/15* (2013.01); *H03F 2200/18* (2013.01); *H03F 2200/451* (2013.01)
(58) Field of Classification Search
  USPC .................................................. 330/136, 311
  See application file for complete search history.

(56) References Cited

U.S. PATENT DOCUMENTS

2012/0056678 A1   3/2012  Wang
2014/0184334 A1*  7/2014  Nobbe .................. H03F 1/0227
                                                              330/291

OTHER PUBLICATIONS

Written Opinion of the International Searching Authority issued in corresponding International application No. PCT/EP2014/055581, date of mailing Apr. 28, 2014.
Extended Search Report issued in corresponding European application No. 13 16 0179, date of mailing Jun. 12, 2013.

* cited by examiner 2.5GHz - 2.6GHz

AMPLIFIER TOPOLOGY FOR ENVELOPE TRACKING

FIELD OF THE DISCLOSURE

The present disclosure relates to an amplifier, and electronic apparatus comprising an amplifier, and a method of amplification.

BACKGROUND TO THE DISCLOSURE

Advances in radio technology have led to a demand for a higher level of circuit integration, with different circuits being integrated into a single system on a chip. For example, a radio frequency (RF) front end may include a power amplifier, a low noise amplifier and a switch. Integration of a power amplifier in complementary metal oxide silicon (CMOS) technology can enable a low cost but, for RF usage, such a power amplifier is required to sustain a high power output at a high frequency. Ideally, the power amplifier should combine high power with high efficiency, without efficiency being reduced when the amplifier is operated at low power. One known solution is based on the use of a high efficiency power transistor with power regulation, such as envelope tracking.

Referring to FIG. 1, a basic amplifier 10 without envelope tracking has a transistor 12 having a gate coupled to a signal source 11 by means of a first capacitor 13. A drain of the transistor 12 is coupled to a voltage supply node 14 at a constant supply voltage $V_{dd}$ by means of an inductor 15. A load 17 is coupled to the drain of the transistor 12 by means of a second capacitor 16. FIG. 3, graph (a) illustrates an amplified signal at the drain of the transistor 12. Due to the inductor 15, the drain has a voltage swing between zero and about $2V_{dd}$. In FIG. 3, the area between the amplified signal and the constant voltage $2V_{dd}$ represents power that is unused, not being delivered to the load 17, instead being dissipated as heat, thereby resulting in a low efficiency. Biasing of the gate of the transistor 12 is not illustrated in FIG. 3.

Referring to FIG. 2, an amplifier 20 including envelope tracking has the same components as the basic amplifier of FIG. 1, coupled in the same way, except that the voltage supply node 14 is at a non-constant supply voltage $V_{env}$ instead of the constant supply voltage $V_{dd}$, and the amplifier 20 comprises an envelope tracking stage (ENV) 18 coupled between the signal source 11 and the voltage supply node 14. The envelope tracking stage 18 generates the non-constant supply voltage $V_{env}$ which tracks the envelope of the signal delivered by the signal source 11, having a maximum value of $V_{dd}$. The non-constant supply voltage $V_{env}$ may therefore be referred to as an envelope signal $V_{env}$. FIG. 3, graph (b) illustrates the amplified signal at the drain of the transistor 12 of the amplifier 20, which is unchanged from FIG. 3, graph (a) and, due to the inductor 15, has an amplitude of about $2V_{env}$ and can reach a maximum of about $2V_{dd}$. FIG. 3, graph (b) also illustrates twice the non-constant supply voltage $V_{env}$. The only power that is dissipated is represented by the area between the amplified signal and twice the non-constant supply voltage $V_{env}$. It can be seen that compared with FIG. 3, graph (a), power efficiency is improved by the envelope tracking and heat dissipation is reduced.

There is a requirement for an improved amplifier and method of amplification.

SUMMARY OF THE PREFERRED EMBODIMENTS

According to a first aspect there is provided an amplifier comprising:

an input port for receiving an input signal, an envelope port for receiving an envelope signal indicative of an envelope of the input signal, and an output port for delivering an amplified signal;

a first transistor and a second transistor, wherein a drain of the first transistor is coupled to a source of the second transistor, and a drain of the second transistor is coupled to the output port;

an inductive element coupled between the envelope port and the drain of the second transistor;

a first biasing circuit coupled to the envelope port and arranged to generate a first bias voltage dependent on the envelope signal;

a summing stage coupled to the input port for receiving the input signal, coupled to the first biasing circuit for receiving the first bias voltage, coupled to a gate of the first transistor, and arranged to deliver a sum of the input signal and first bias voltage to the gate of the first transistor;

a second biasing circuit coupled between the envelope port and a gate of the second transistor, and arranged to generate a second bias voltage dependent on the envelope signal and to deliver the second bias voltage to the gate of the second transistor.

According to a second aspect there is provided a method of amplification, comprising:

providing a first transistor and a second transistor, wherein a drain of the first transistor is coupled to a source of the second transistor and a drain of the second transistor is coupled to an output port;

providing an inductive element coupled between an envelope port and the drain of the second transistor;

receiving an input signal;

receiving at the envelope port an envelope signal indicative of an envelope of the input signal;

generating a first bias voltage dependent on the envelope signal;

delivering a sum of the first bias voltage and the input signal to a gate of the first transistor;

generating a second bias voltage dependent on the envelope signal, and delivering the second bias voltage to a gate of the second transistor; and delivering an amplified signal at the output port.

By employing cascaded transistors for envelope tracking, the amplifier can enable an increased voltage range at the output, with high power efficiency. The use of cascaded transistors can also enable an increased isolation between the output and input of the amplifier, improving stability and reducing the impact on the input impedance of variation in the load impedance, enabling improved linearity. By controlling the bias voltage applied to the gate of each transistor dependent on the envelope signal, such that the bias voltages can track the envelope signal, the amplifier can have a reduced variation in gain as the input power level changes.

The first bias voltage may dependent on the envelope signal for a range of values of the envelope signal, and may be independent of the envelope signal outside of the range of values of the envelope signal. Therefore, circuitry for controlling the first bias voltage dependent on the envelope signal may be disabled when the envelope signal is outside of the range of values of the envelope signal, thereby reducing power consumption.

The range of values of the envelope signal for which the first bias voltage is dependent on the envelope signal may correspond to the envelope signal having a value less than a threshold, and the first bias voltage may be constant in response to the envelope signal having a value greater than the threshold. Therefore, circuitry for controlling the first bias voltage dependent on the envelope signal may be disabled when the envelope signal is greater than the threshold, thereby reducing power consumption. Nevertheless, a low variation in gain may be provided as, at high values of the envelope signal, the variation in gain as the input power changes can be relatively low.

The first and second bias voltages dependent on the envelope signal may each be an affine function of the envelope signal. This enables low complexity control of the first and second bias voltages.

The first bias voltage, $V_{bias1}$, dependent on the envelope signal may be related to the envelope signal by $V_{bias1}=S_1.V_{env}+V_{bias1\_0}$, and the second bias voltage, $V_{bias2}$, may be related to the envelope signal by $V_{bias2}=S_2.V_{env}+V_{bias2\_0}$, where $V_{env}$ is the envelope signal, $S_1$ is a first constant, $V_{bias1\_0}$ is a first quiescent voltage, $S_2$ is a second constant and $V_{bias2\_0}$ is a second quiescent voltage. Such relationships between the first bias voltage and the envelope signal, and between the second bias voltage and the envelope signal, are linear and may be implemented with low complexity.

The first biasing circuit may comprise a first voltage divider arranged to generate a first divided envelope signal $S_1.V_{env}$ by dividing the envelope signal, and the second biasing circuit may comprise a second voltage divider arranged to generate a second divided envelope signal $S_2.V_{enc}$ by dividing the envelope signal. Likewise, in the method of amplification, generating the first bias voltage dependent on the envelope signal may comprise generating a first divided envelope signal $S_1.V_{env}$ by dividing the envelope signal, and generating the second bias voltage dependent on the envelope signal may comprise generating a second divided envelope signal $S_s.V_{env}$ by dividing the envelope signal. Such voltage dividers and division may be implemented with low complexity.

The first voltage divider may comprise a first resistive element having a variable resistance for establishing the first constant, and the second voltage divider may comprise a second resistive element having a variable resistance for establishing the second constant. This feature enables a straightforward way of calibrating the amplifier.

The first and second biasing circuits may be arranged to generate the first and second bias voltages by providing values for the first and second quiescent voltages and the first and second constants, such that, in the absence of the input signal, a current drawn by the amplifier, or by the first and second transistors, varies by less than 10% in response to variation of the envelope signal across a maximum operating range of the amplifier, or of the first and second transistors. Likewise the method of amplification may comprise generating the first and second bias voltages by providing values for the first and second quiescent voltages and the first and second constants, such that, in the absence of the input signal, a current drawn by the first and second transistors varies by less than 10% in response to variation of the envelope signal across a maximum operating range of the first and second transistors. This enables a substantially constant gain to be maintained at a low power level, despite variation of the power of the input signal.

The amplifier may comprise an envelope tracking stage arranged to generate the envelope signal in response to the input signal. However, this is not essential and alternatively the envelope signal may be generated externally to the amplifier. Likewise, the method of amplification may comprise generating the envelope signal in response to the input signal. However, this is not essential and alternatively the envelope signal may be generated externally to the method of amplification.

The envelope tracking stage may be arranged to generate the envelope signal quantised to have fewer values than the envelope of the input signal. Likewise, the method of amplification may comprise generating the envelope signal quantised to have fewer values than the envelope of the input signal. This feature can reduce the processing and power consumption.

There is also provided an electronic apparatus comprising the amplifier according to the first aspect.

BRIEF DESCRIPTION OF THE DRAWINGS

Preferred embodiments will now be described, by way of example only, with reference to the accompanying drawings, in which.

DETAILED DESCRIPTION OF PREFERRED EMBODIMENTS

Figure 4:
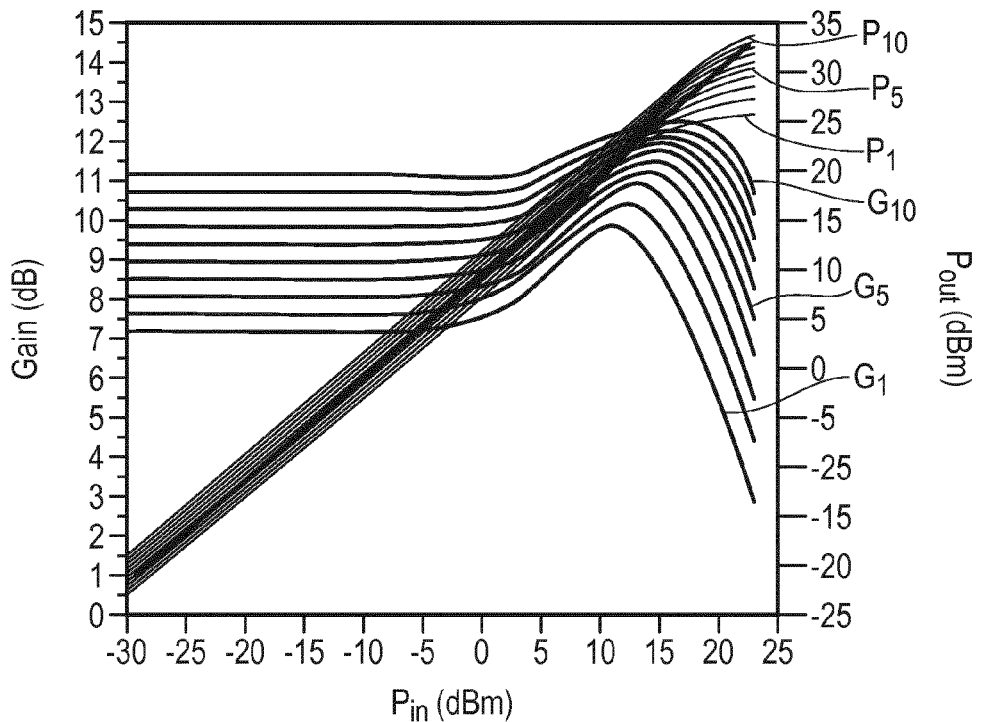
FIG. 4 is a graph of gain and output power for the prior art amplifiers.

This section commences with further description of some of the characteristics of the prior art amplifiers 10, 20 for the purpose of identifying the differences and advantages of the amplifier and method of amplification according to the present disclosure. Referring to FIG. 4, curves $G_1$, $G_5$ and $G_{10}$ are plots of gain of the amplifier 10 of FIG. 1, as a function of input power $P_{in}$ of the signal source 11, for different values of the constant supply voltage $V_{dd}$ of, respectively 1, 5 and 10V. It can be seen that the gain is dependent on the constant supply voltage $V_{dd}$, being lower for lower values of the constant supply voltage $V_{dd}$, but for each value of the constant supply voltage $V_{dd}$, for low values of the input power $P_{in}$, up to about 0 dBm, the gain is fairly constant, and as the input power $P_{in}$ is increased to 25 dBm, the gain rises, and then falls again as the amplifier 10 goes into compression. When envelope tracking is used, as in the amplifier 20 of FIG. 2, the variation in gain becomes even greater, because for a high input power $P_{in}$ the non-constant supply voltage $V_{env}$ is high and the curve $G_{10}$ is applicable, whilst for a low input power $P_{in}$ the non-constant supply voltage $V_{env}$ is low and the curve $G_1$ is applicable. Therefore, the gain of the amplifier 20 of FIG. 2 can vary significantly with the voltage variation of the non-constant supply voltage $V_{env}$, in effect moving between the curves $G_1$, $G_{10}$ and intermediate curves. Consequently, the use of envelope tracking can degrade linearity of the amplifier 20. Moreover the compression point of the amplifier 20 of FIG. 2 degrades, by shifting to lower levels of input power $P_{in}$ as the as the non-constant supply voltage $V_{env}$ increases.

Figure 1:
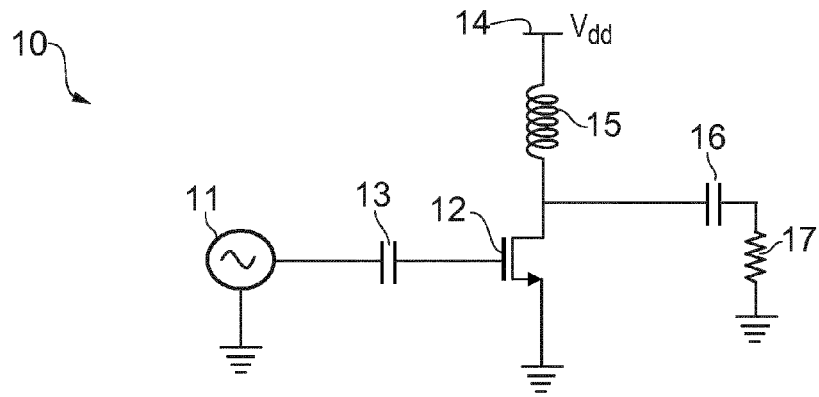
FIG. 1 is a schematic diagram of a prior art amplifier.
Figure 5:
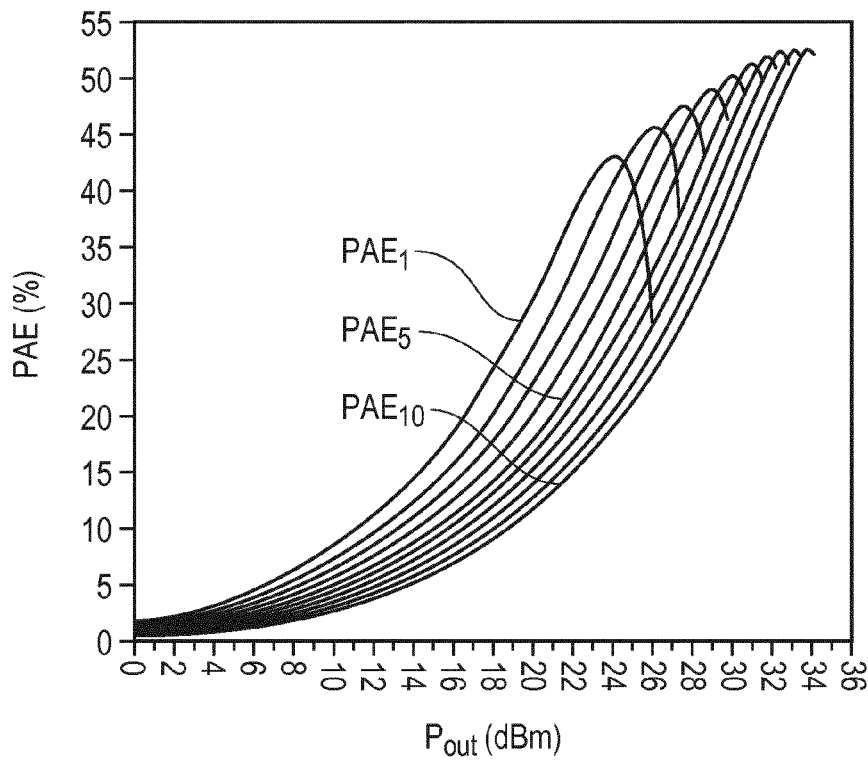
FIG. 5 is a graph of power added efficiency for the prior art amplifiers.

Similarly, graphs $P_1$, $P_5$ and $P_{10}$ are plots of output power $P_{out}$ of the amplifier 10 of FIG. 1, as a function of input power $P_{in}$ of the signal source 11, for different values of the constant supply voltage $V_{dd}$ of, respectively 1, 5 and 10V. The output power $P_{out}$ is dependent on the input power $P_{in}$ and the constant supply voltage $V_{dd}$, being lower for lower values of the constant supply voltage $V_{dd}$, due to the lower gain, but for each value of the constant supply voltage $V_{dd}$, for low values of the input power $P_{in}$, up to about 10 dBm, the ratio of output power $P_{out}$ to input power $P_{in}$, that is, gain, is fairly constant, but reduces as the input power $P_{in}$ is increased further to 25 dBm. This behaviour is illustrated alternatively in FIG. 5 which illustrates, in curves $PAE_1$, $PAE_5$ and $PAE_{10}$, the Power Added Efficiency (PAE) of the amplifier 10 of FIG. 1 as a function of output power $P_{out}$ for different values of the constant supply voltage $V_{dd}$ of, respectively 1, 5 and 10V. When envelope tracking is used, as in the amplifier 20 of FIG. 2, the PAE can be maintained within an optimum range by increasing the non-constant supply voltage $V_{env}$ such that a higher peak PAE can be reached when operating at a higher power level, and decreasing the non-constant supply voltage $V_{env}$ such that a higher PAE can be reached when operating at a low power level.

Figure 2:
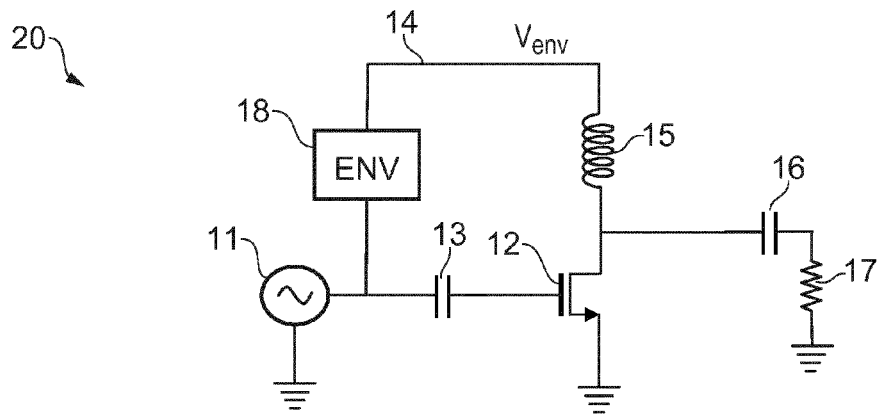
FIG. 2 is a schematic diagram of a prior art amplifier with envelope tracking.
Figure 3:
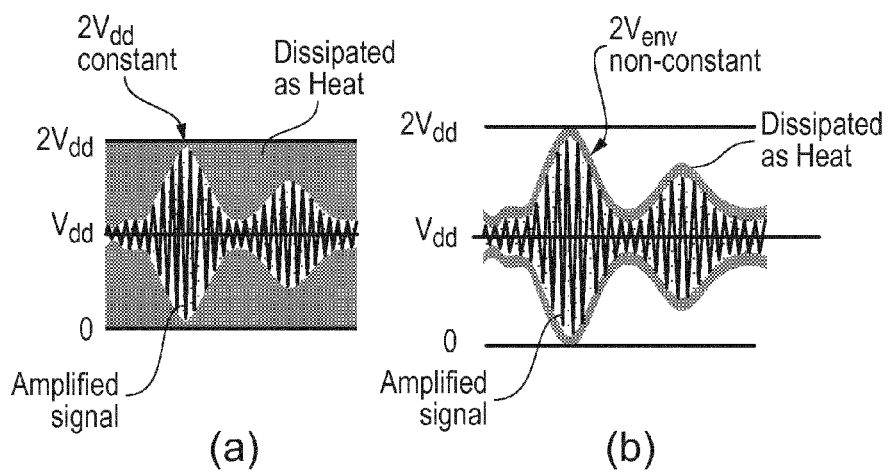
FIG. 3 illustrates the power efficiency of the prior art amplifiers.

It has been found that, when using the amplifier 20 illustrated in FIG. 2, when the amplitude of the input signal changes, the input impedance of the amplifier 20 can also change due to poor isolation between the gate and drain of the transistor 12. It has also been found that, if the amplifier 20 is designed for linear and power-efficient operation at a high power level, at a low power level the amplifier 20 can be inefficient and linearity degraded by the use of the envelope tracking. For optimum linearity and PAE, the gain of the amplifier 20 should be constant at all input power levels.

Figure 6:
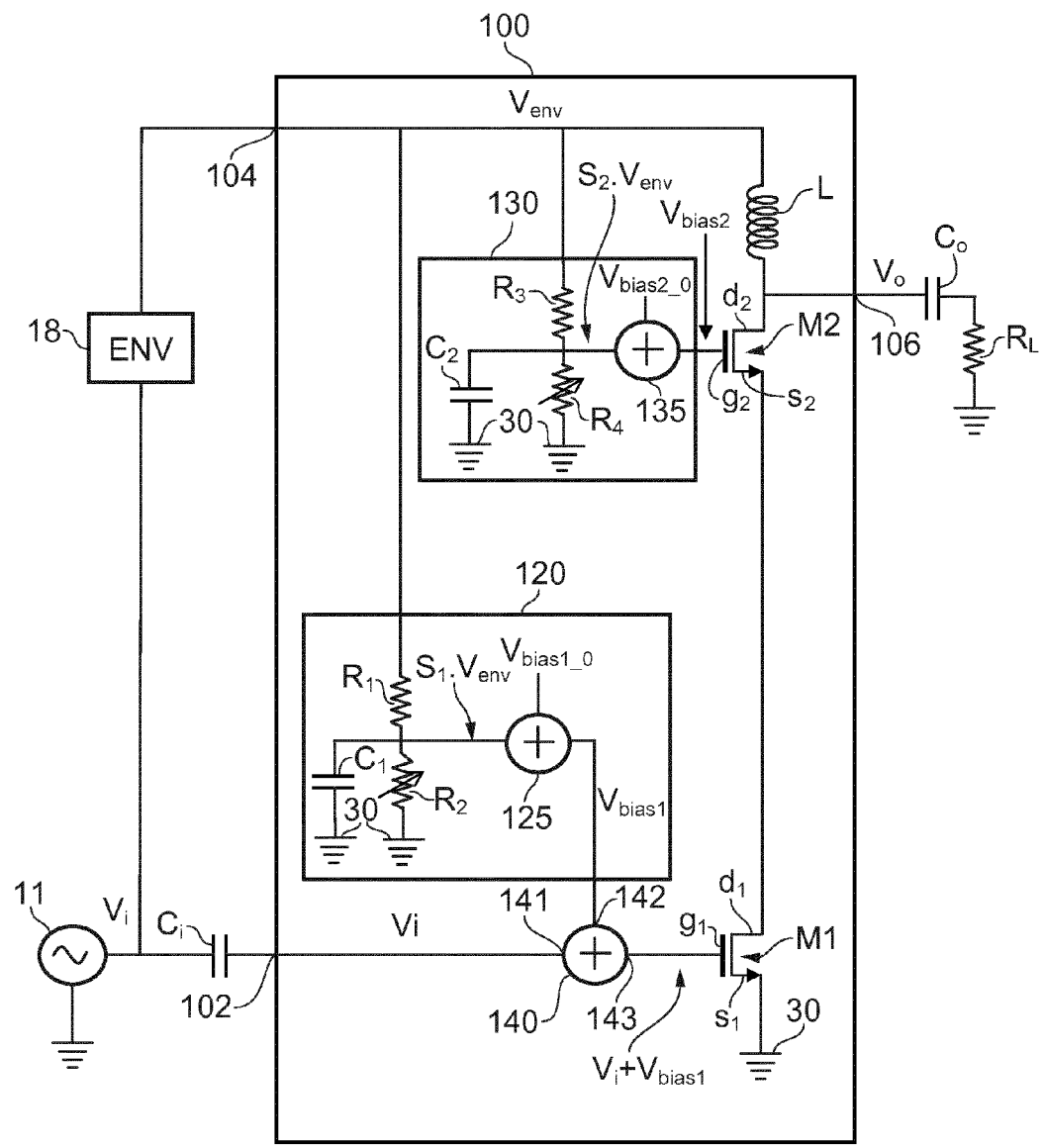
FIG. 6 is a first embodiment of an amplifier in accordance with the present disclosure.

Referring to FIG. 6, an amplifier 100 has an input port 102 for receiving an input signal $V_i$, an envelope port 104 for receiving an envelope signal $V_{env}$ indicative of an envelope of the input signal $V_i$, and an output port 106 for delivering an amplified signal, also referred to as an output signal. The input port 102 is coupled to a signal source 11, which delivers the input signal $V_i$, by means of an input coupling capacitor $C_i$. The envelope port 104 is coupled to the signal source 11 by means of an envelope tracking stage 18. The envelope tracking stage 18 receives the input signal $V_i$ from the signal source 11 and generates the envelope signal $V_{env}$, which it delivers to the envelope port 104. The output port 106 is coupled to a load $R_L$ by means of an output coupling capacitor $C_o$.

The amplifier 100 has a first transistor M1 and a second transistor M2. A drain $d_1$ of the first transistor M1 is coupled to a source $s_2$ of the second transistor M2, the first and second transistors M1, M2 being coupled in a cascode configuration, with the first transistor M1 in a common source configuration and the second transistor M2 in a common gate configuration. A gate $g_1$ of the first transistor M1 is coupled to an output 143 of a first summing stage 140, and a drain $d_2$ of the second transistor M2 is coupled to the output port 106. A source $s_1$ of the first transistor M1 is coupled to a first voltage supply rail 30, which may be ground. An inductive element L is coupled between the envelope port 104 and the drain $d_2$ of the second transistor M2, for applying the envelope signal $V_{env}$ to the cascode arrangement of the first and second transistors M1, M2. The first summing stage 140 has a first input 141 coupled to the input port 102 for receiving the input signal $V_i$, a second input 142 for receiving a first bias voltage Vbias1, and the output 143 of the summing stage 140 delivers a sum of the input signal $V_i$ and the first bias voltage $V_{bias1}$.

A first biasing circuit 120 is coupled between the envelope port 104 and the second input 142 of the first summing stage 140, and generates the first bias voltage $V_{bias1}$ dependent on the envelope signal $V_{env}$. In particular, the first biasing circuit 120 may comprise a first resistive element $R_1$ and a second resistive element $R_2$ coupled in series between the envelope port 104 and the first voltage rail 30 thereby forming a first voltage divider providing, at a junction between the first and second resistive elements $R_1$, $R_2$, a first divided envelope signal $S_1.V_{env}$, where $S_1$ is a first constant less than unity. A second summing stage 125 is coupled to the junction between the first and second resistive elements $R_1$, $R_2$ and adds a first quiescent bias voltage $V_{bias1\_0}$ to the first divided envelope signal $S_1.V_{env}$ thereby forming the first bias voltage $V_{bias1}$ which is delivered to the second input 142 of the first summing stage 140. The second resistive element $R_2$ has a variable resistance whose value may be selected by a calibration process as described below, but alternatively, or additionally, the first resistive element $R_1$ may have a variable resistance.

A second biasing circuit 130 is coupled between the envelope port 104 and the gate $g_2$ of the second transistor M2, and generates a second bias voltage $V_{bias2}$ dependent on the envelope signal $V_{env}$, and provides the second bias voltage $V_{bias2}$ to the gate $g_2$ of the second transistor M2. In particular, the second biasing circuit 130 may comprise a third resistive element $R_3$ and a fourth resistive element $R_4$ coupled in series between the envelope port 104 and the first voltage rail 30 thereby forming a second voltage divider providing, at a junction between the third and fourth resistive elements $R_3$, $R_4$, a second divided envelope signal $S_2.V_{env}$, where $S_2$ is a second constant less than unity. A third summing stage 135 is coupled to the junction between the third and fourth resistive elements $R_3$, $R_4$ and adds a second quiescent bias voltage $V_{bias2\_0}$ to the second divided envelope signal $S_2.V_{env}$ thereby forming the second bias voltage $V_{bias2}$ which is delivered to the gate $g_2$ of the second transistor M2. The fourth resistive element $R_4$ has a variable resistance whose value may be selected by calibration as described below, but alternatively, or additionally, the third resistive element $R_3$ may have a variable resistance.

The first and second bias voltages $V_{bias1}$, $V_{bias2}$ are therefore dependent on the envelope signal $V_{env}$, both tracking the envelope signal $V_{env}$, and therefore both tracking each other. In particular, the first and second bias voltages $V_{bias1}$, $V_{bias2}$ are each related to the envelope signal $V_{env}$ by an affine function.

The dependence of the first and second bias voltages $V_{bias1}$, $V_{bias2}$ on the envelope signal $V_{env}$ may be expressed as, respectively, $$V_{bias1} = S_1 \cdot V_{env} + V_{bias1\_0} \quad (1)$$

$$V_{bias2} = S_2 \cdot V_{env} + V_{bias2\_0} \quad (2)$$

The first and second constants $S_1$, $S_2$ and the first and second quiescent bias voltages $V_{bias1\_0}$ and $V_{bias2\_0}$ may be selected by a calibration process as described below. The first and second quiescent bias voltages $V_{bias1\_0}$ and $V_{bias2\_0}$ correspond to values of, respectively, the first and second bias voltages $V_{bias1}$, $V_{bias2}$ when the input signal $V_0$ is absent or has a zero amplitude or envelope, that is, the envelope signal $V_{env}$ is zero. Typically, the first and second quiescent bias voltages $V_{bias1\_0}$, $V_{bias2\_0}$ may be about 0.65V and 2V.

The first constant $S_1$ is determined by the ratio of the resistance of the second resistive element $R_2$ to the sum of the resistances of the first and second resistive elements $R_1$, $R_2$, that is, the first constant $S_1$ may be represented as $S_1 = R_2/(R_1 + R_2)$, where $R_1$ and $R_2$ represent the respective resistance values. Likewise, the second constant $S_2$ is determined by the ratio of the resistance of the fourth resistive element $R_4$ to the sum of the resistances of the third and fourth resistive elements $R_3$, $R_4$, that is, the second constant $S_2$ may be represented as $S_2 R_4/(R_3 + R_4)$, where $R_3$ and $R_4$ represent the respective resistance values.

The amplifier has a first capacitive element $C_1$ coupled between the first voltage rail 30 and the junction of the first and second resistive elements $R_1$, $R_2$. Likewise, there is a second capacitive element $C_2$ coupled between the first voltage rail 30 and the junction of the third and fourth resistive elements $R_3$, $R_4$. The capacitance of the first capacitive element $C_1$ and the capacitance of the second capacitive element $C_2$ are chosen to provide low impedance to the input signal $V_i$ and to the envelope signal $V_{env}$.

In operation, the first transistor M1 amplifies the input signal, which may be at RF, and the second transistor M2, in conjunction with the inductive element L, follows, that is, tracks, the voltage at the first drain $d_1$ of the first transistor M1, increasing the voltage swing at the output port 106, and consequently increasing the output power. The coupling of the first and second transistors M1, M2 in a cascode configuration provides increased isolation between the input port 102 and the output port 106, compared with the use of a single transistor as in the amplifier 20 of FIG. 2, thereby reducing the variation in input impedance of the amplifier 100 as the envelope signal $V_{env}$ varies. The voltage at the output port 106 is the sum of the drain-to-source voltages of the first and second transistors M1, M2, and the first and second transistors M1, M2 both drive a load current in the load $R_L$ in the same direction.

Figure 7:
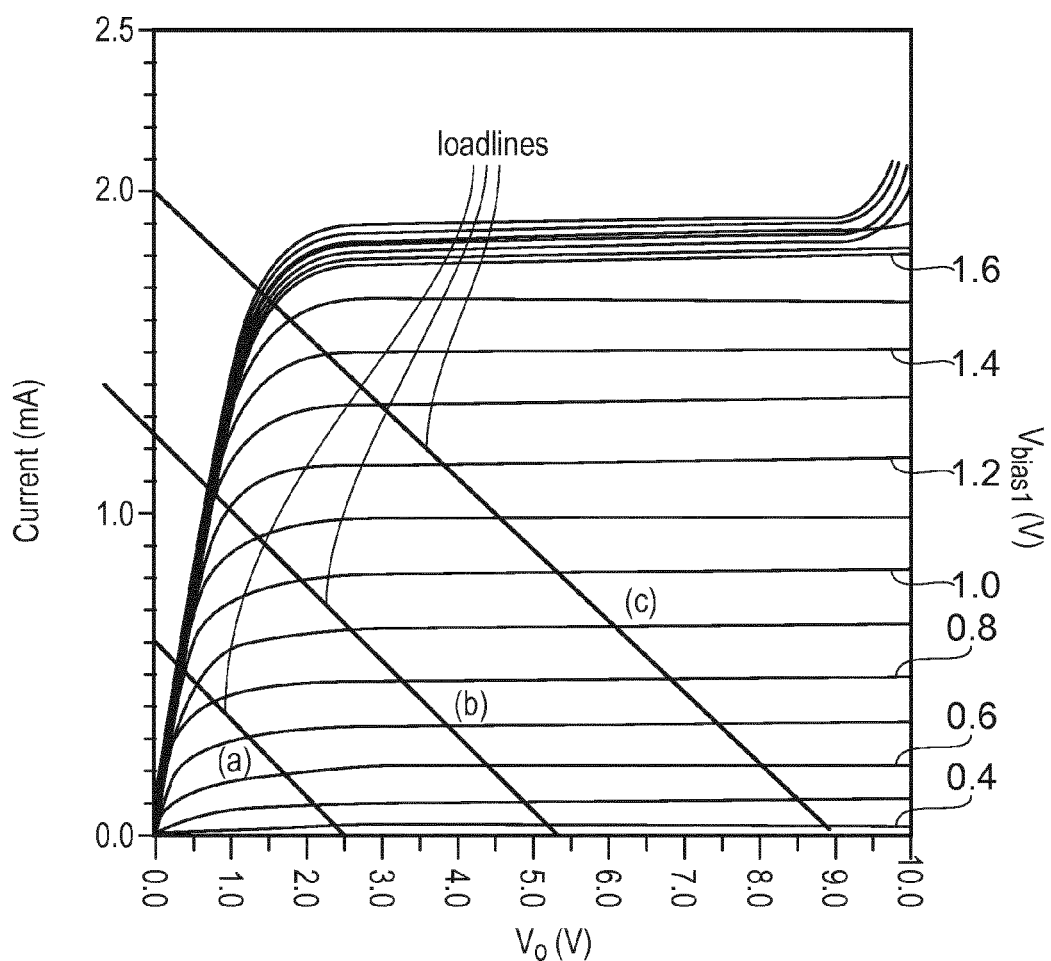
FIG. 7 illustrates load lines for different values of the envelope signal.

FIG. 7 illustrates load lines for the amplifier 100 for the case of the load $R_L$ having a resistance of 4.5Ω, superimposed on a plot of voltage-current characteristics of the amplifier 100, where the vertical axis of the voltage-current characteristics represents the current flowing through both the first and second transistors M1, M2 between the drain $d_2$ of the second transistor M2 and the first voltage rail 30, and the horizontal axis represents the output signal $V_o$, that is, the voltage at the drain $d_2$ of the second transistor M2. The output signal $V_o$ reaches a maximum value of 9V, corresponding to the sum of a 3V drain-source voltage across the first transistor M1, and a 6V drain-source voltage across the second transistor M2. The position of the load lines is dependent on the envelope signal $V_{env}$, and three load lines (a), (b) and (c) are illustrated in FIG. 7 for three values of the envelope signal $V_{env}$, the load line (a) being applicable when the envelope signal $V_{env}$ has a relatively low voltage, and load line (c) being applicable when the envelope signal $V_{env}$ has a relatively high voltage. As the envelope signal varies, the second bias voltage $V_{bias2}$ varies. With no further action, this variation would tend to cause the gain of the amplifier 100 to vary in the manner illustrated in FIG. 4, resulting in a low gain when the envelope signal $V_{env}$ has a low voltage. However, the first bias signal $V_{bias1}$ applied to the gate $g_1$ of the first transistor M1 also varies and acts to compensate this variation in gain by increasing the bias point of the first transistor M1.

Figure 8:
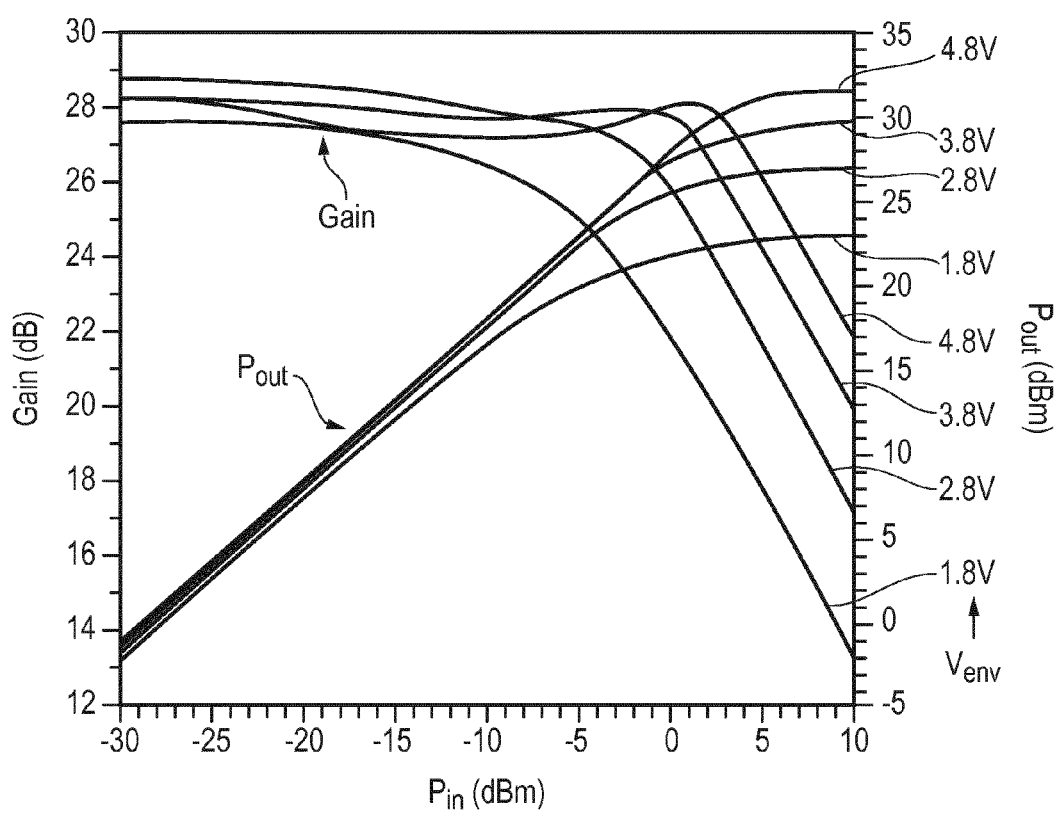
FIG. 8 is a graph of gain and output power as a function of input power for an amplifier with tracking bias voltages in accordance with the present disclosure.

Referring to FIG. 8, there are plotted curves of gain, and curves of output power $P_{out}$, that is, the power of the output signal $V_o$, both as a function of input power $P_{in}$, that is, the power of the input signal $V_i$. The gain is the ratio of output power $P_{out}$ to input power $P_{in}$. The curves of gain and output power $P_{out}$ are each plotted for four different constant values of the envelope signal $V_{env}$, respectively 1.8, 2.8, 3.8 and 4.8V. FIG. 8 relates to the amplifier topology described with reference to FIG. 6, except that, for the purpose of illustration, the envelope signal $V_{env}$ is held constant at each of the respective values and does not vary as the input power $P_{in}$ varies. Nevertheless, the first and second bias voltages $V_{bias1}$, $V_{bias2}$ are dependent on the respective constant values of the envelope signal $V_{env}$. It can be seen that at low levels of input power $P_{in}$ the gain is fairly constant and the output power $P_{out}$ rises linearly with increasing input power $P_{in}$, until the onset of compression. Compression occurs at a higher level of input power $P_{in}$ as the constant envelope signal $V_{env}$ is increased. At low levels of the input power $P_{in}$, a high gain can be provided by a low value of the constant envelope signal $V_{env}$, whilst at high levels of the input power $P_{in}$, for high gain and low compression, a high value of the constant envelope signal $V_{env}$ is advantageous. Therefore, an improved combination of high gain and constant gain over a wide range of input power $P_{in}$ levels is provided by the amplifier 100 when the envelope signal $V_{env}$ tracks the envelope of the input signal $V_i$ and the first and second bias voltages $V_{bias1}$, $V_{bias2}$ are dependent on the envelope signal $V_{env}$ according to equations (1) and (2).

Figure 9:
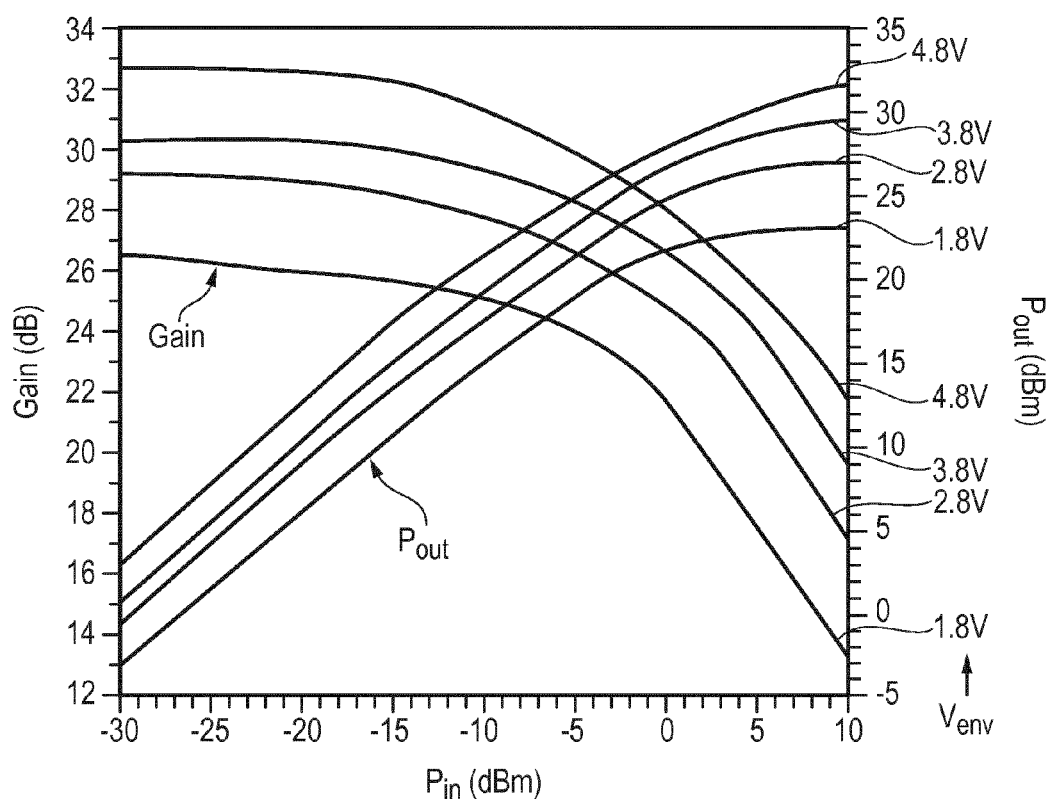
FIG. 9 is a graph of gain and output power as a function of input power without tracking bias voltages.

For comparison, the corresponding curves to those in FIG. 8 for the amplifier 100 of FIG. 6 are plotted in FIG. 9 for an amplifier comprising cascaded transistors but where the first and second bias voltages $V_{bias1}$, $V_{bias2}$ are maintained constant and do not track the envelope signal $V_{env}$. It can be seen from FIG. 9 that, as the level of the envelope signal reduces, the gain reduces substantially, and that the onset of compression occurs at a lower level of input power $P_{in}$. Therefore, for such operation of an amplifier, in which the first and second bias voltages $V_{bias1}$, $V_{bias2}$ are maintained constant, there is a large variation in gain as the input power $P_{in}$ of the input signal $V_i$ varies and the envelope signal $V_{env}$ tracks the envelope of the input signal $V_i$. This demonstrates the benefit of generating the first and second bias voltages $V_{bias1}$, $V_{bias2}$, dependent on the envelope signal $V_{env}$.

Figure 10:
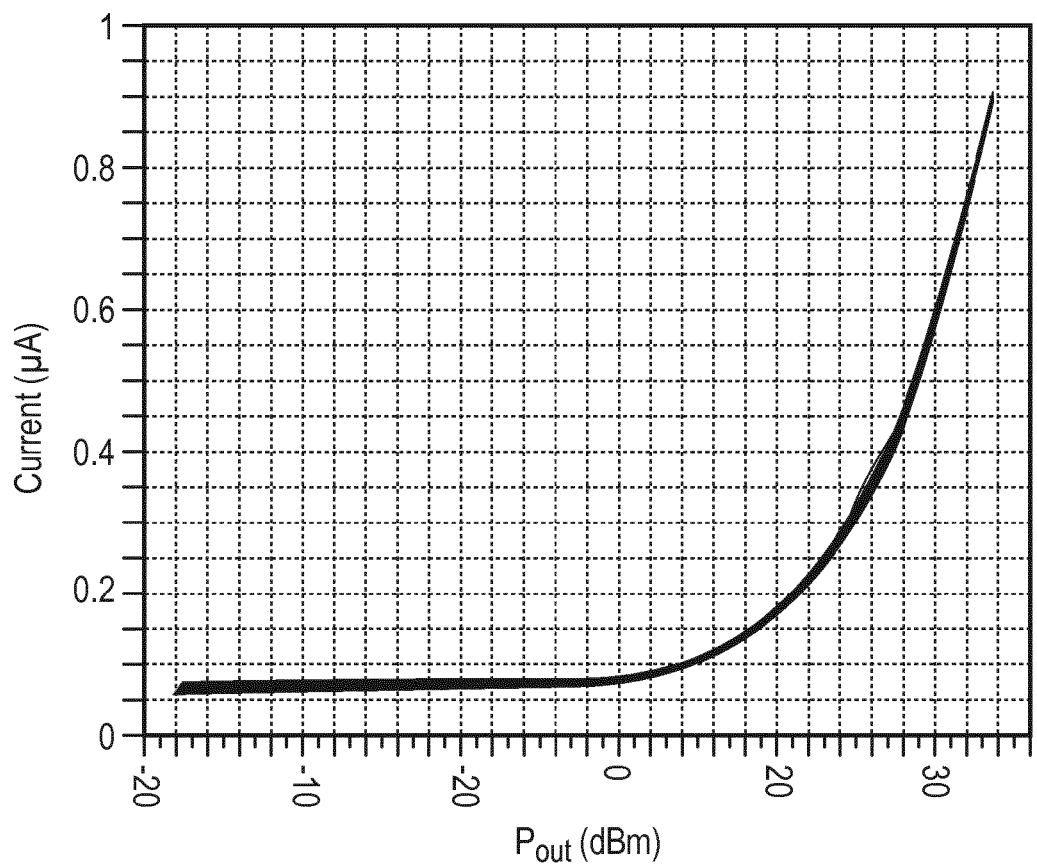
FIG. 10 is a graph of current as a function of output power.

Referring to FIG. 10, there are plotted curves of current drawn by the amplifier 100 as a function of output power $P_{out}$, that is, the power of the output signal $V_o$. The curves are plotted for different constant values of the envelope signal $V_{env}$. As for FIG. 8, FIG. 10 relates to the amplifier topology described with reference to FIG. 6, except that, for the purpose of illustration, the envelope signal $V_{env}$ is held constant at each of the respective values and does not vary as the input power $P_{in}$, and consequently the output power $P_{out}$, varies. Nevertheless, the first and second bias voltages $V_{bias1}$, $V_{bias2}$ are dependent on the respective constant values of the envelope signal $V_{env}$. It can be seen that, as the curves are close together, the current is largely independent of the value of the envelope signal $V_{env}$, and this characteristic enables a low variation in input impedance when the output signal and load impedance varies, thereby presenting a constant load to the signal source 11, and consequently improved linearity and stability of the signal source, when the envelope signal $V_{env}$ tracks the envelope of the input signal $V_i$ and the first and second bias voltages $V_{bias1}$, $V_{bias2}$ are dependent on the envelope signal $V_{env}$ according to equations (1) and (2).

Figure 11:
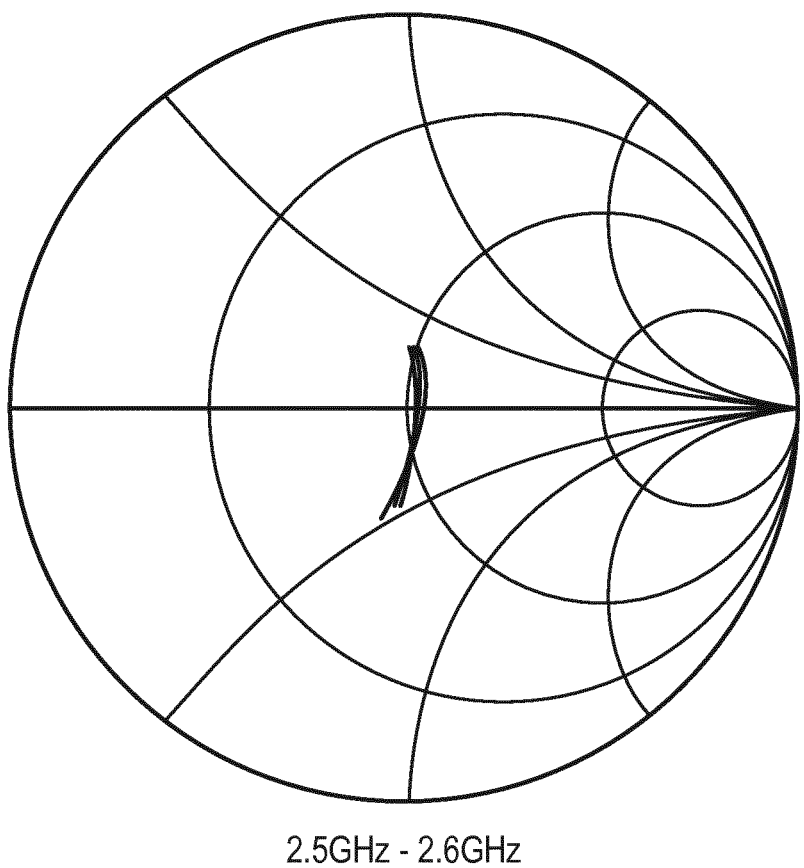
FIG. 11 is a Smith chart illustrating input impedance.

Referring to FIG. 11, there is plotted on a Smith chart the variation of input impedance of the amplifier 100 over a range of frequencies from 2.5 GHz to 2.6 GHz. There are several curves plotted, each for a different constant amplitude of the input signal $V_i$, and consequently for a different constant value of the envelope signal $V_{env}$. Nevertheless, the first and second bias voltages $V_{bias1}$, $V_{bias2}$ are dependent on the respective constant values of the envelope signal $V_{env}$. It can be seen that, as the curves are close together, the input impedance is largely independent of the constant envelope signal $V_{env}$, indicating that input impedance is largely constant when the envelope of the input signal $V_o$, and consequently the envelope signal $V_{env}$, output signal and load impedance vary, thereby contributing to linear and stable operation of the input source 11.

Figure 12:
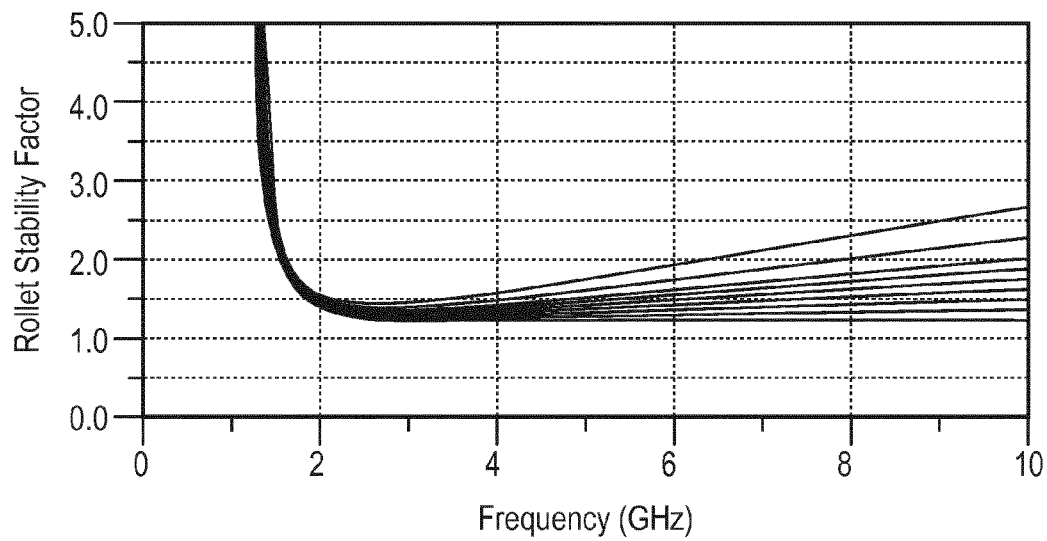
FIG. 12 is a graph of Rollet stability factor.

The high stability of the amplifier 100 is also demonstrated in FIG. 12 in which the Rollett factor is plotted over a range of frequencies for different constant values of the envelope signal $V_{env}$.

Figure 13:
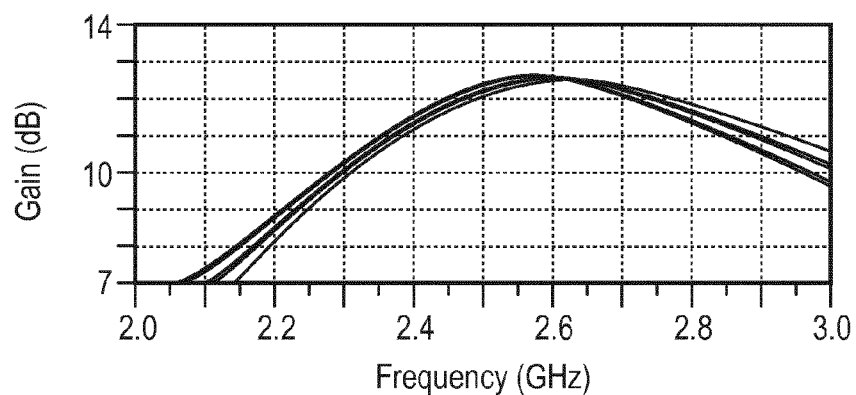
FIG. 13 is a graph of small signal gain as a function of frequency.

Referring to FIG. 13, there is plotted the gain of the amplifier 100 as a function of frequency, with several curves plotted, each for a different constant amplitude of the input signal $V_i$, and consequently for a different constant value of the envelope signal $V_{env}$. Nevertheless, the first and second bias voltages $V_{bias1}$, $V_{bias2}$ are dependent on the respective constant values of the envelope signal $V_{env}$. It can be seen that, around the centre frequency where the gain is highest, as the curves are close together, the gain is largely independent of the constant envelope signal $V_{env}$, indicating that gain is largely constant when the envelope of the input signal $V_o$, and consequently the envelope signal $V_{env}$, varies. This characteristic can contribute to high stability of the amplifier 100.

Figure 14:
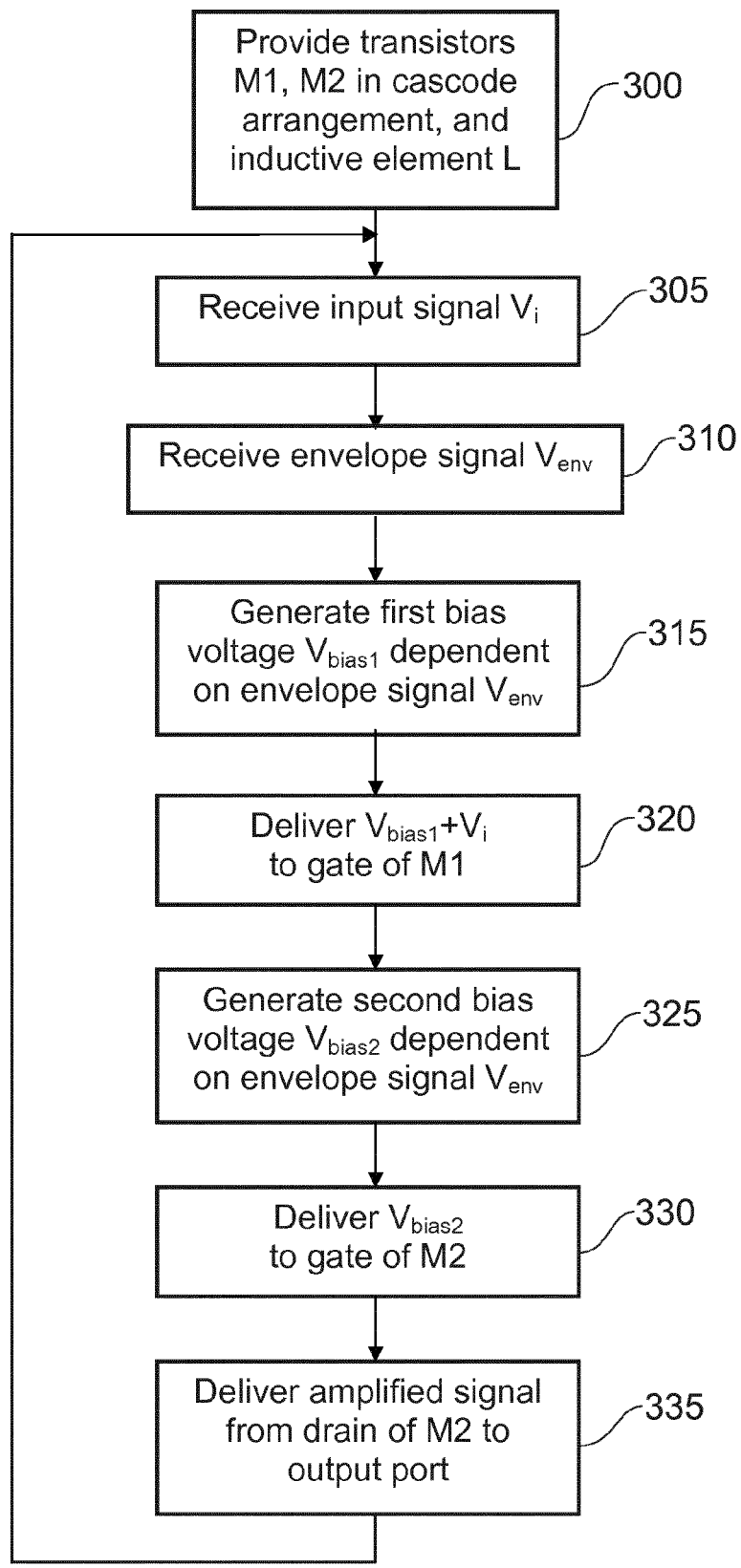
FIG. 14 is a flow chart of a method of amplification.

Referring to FIG. 14, a method of amplification comprises, at step 300, providing the first transistor M1 and the second transistor M2 in a cascode arrangement, that is, the drain $d_1$ of the first transistor M1 is coupled to the source $s_2$ of the second transistor M2 and the drain $d_2$ of the second transistor M2 is coupled to the output port 106. Step 300 also comprises providing the inductive element L coupled between the envelope port 104 and the drain $d_2$ of the second transistor M2.

At step 305, the input signal $V_i$ is received. At step 310, the envelope signal $V_{env}$, indicative of an envelope of the input signal, is received at the envelope port 104.

At step 315, the first bias voltage $V_{bias1}$ is generated which is dependent on the envelope signal. In some embodiments, this dependence may be limited to a range of values of the envelope signal $V_{env}$, with the first bias voltage $V_{bias1}$ being independent of the envelope signal $V_{env}$ outside of this range.

At step 320, the sum of the first bias voltage $V_{bias1}$ and the input signal $V_i$, that is, $V_{bias1}+V_{env}$ is delivered to the gate $g_1$ of the first transistor M1.

At step 325, the second bias voltage $V_{bias2}$ is generated which is dependent on the envelope signal, and at step 330 the second bias voltage $V_{bias2}$ is delivered to the gate $g_2$ of the second transistor M2.

At step 335, the amplified signal, that is, the input signal after amplification, is delivered at the output port 106. Flow then returns to step 305 and the loop is repeated continuously while the input signal $V_i$ is being received and is required to be amplified.

Figure 15:
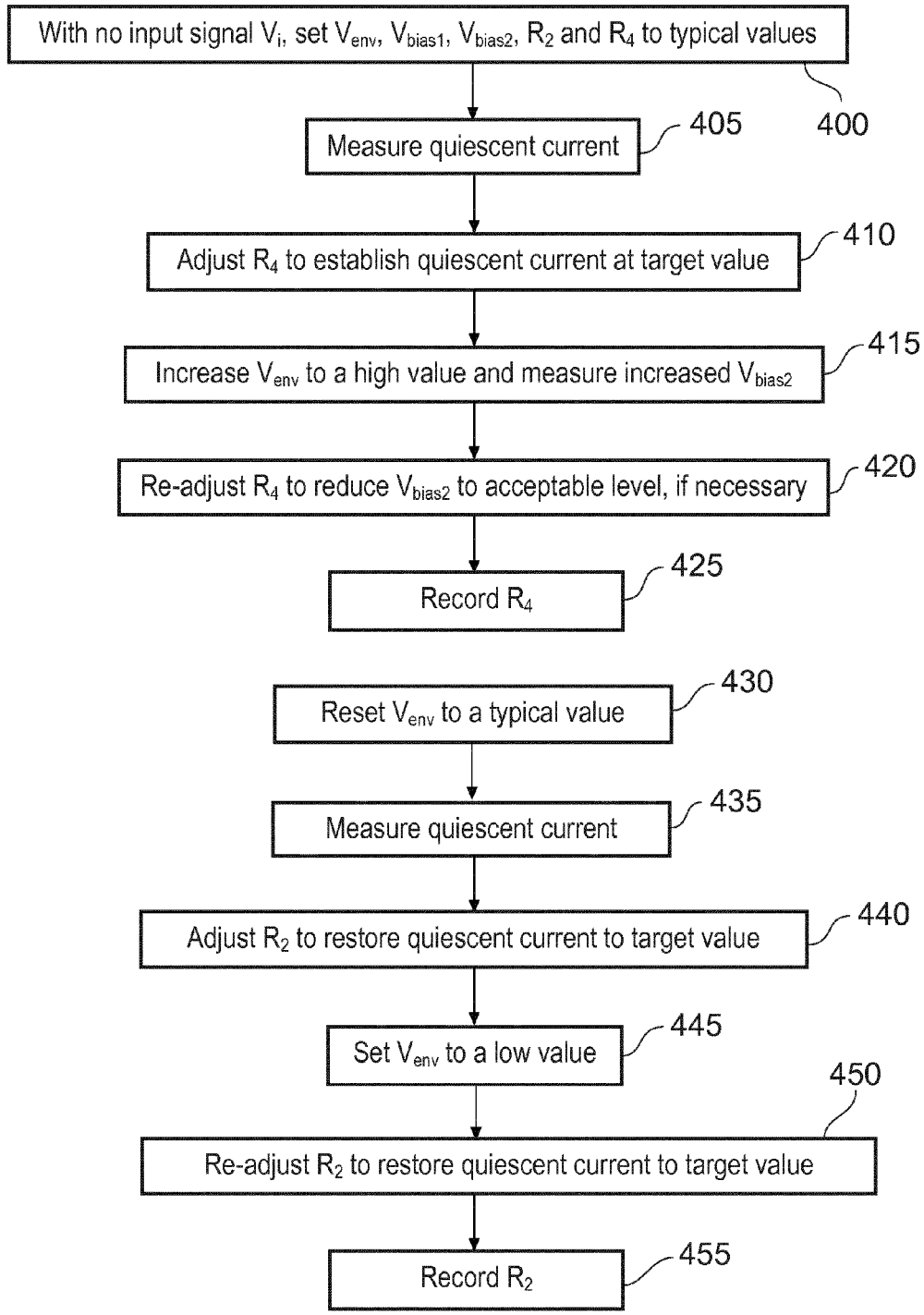
FIG. 15 is a flow chart of a method of calibrating an amplifier.

The values of the first and second constant $S_1$, $S_2$ may be determined by calibration to minimise the variation in gain of the amplifier 100 as the input power $P_{in}$ varies. FIG. 15 illustrates a calibration scheme, although other calibration schemes may be used. The objective of the calibration scheme is to maintain the current drawn by the amplifier 100 as constant as possible at low input power, and therefore for low values of the envelope signal, which can minimise the variation in gain of the amplifier 100 as the input power $P_{in}$ varies. The calibration scheme illustrated in FIG. 15 involves the setting of voltages, the measurement of current, and the control of the variable resistance of the second and fourth resistive elements $R_2$. $R_4$. In the following description of the calibration scheme, calibration apparatus for performing such calibration steps is considered be external to the amplifier 100, and is not illustrated in FIG. 6, although other embodiments may incorporate such calibration apparatus.

Referring to FIG. 15, step 400 consists of initialising the value of variable parameters. At step 400, the input signal $V_i$ is removed from the amplifier 100 by switching off the signal source 11, or otherwise decoupling the signal source 11 from the input port 102 and from the envelope tracking stage 18. Also at step 400, the envelope signal $V_{env}$, first bias voltage $V_{bias1}$ and second bias voltage $V_{bias2}$ are set to respective typical operational values. For example, such typical operational values may be near the centre of the typical operational voltage range of the first and second transistors M1, M2. The values of the first and second bias voltages $V_{bias1}$, $V_{bias2}$ may be set by selecting a value for the envelope signal $V_{env}$, and then adjusting the first and second quiescent bias voltages $V_{bias1\_0}$ and $V_{bias2\_0}$. In particular, the typical operation value of the envelope signal $V_{env}$ may be near the centre of the range of voltages to be supplied by the envelope tracking stage 18. In one example, the maximum voltage to be supplied by the envelope tracking stage 18 may be 5V, and the typical operational value of the envelope signal $V_{env}$ may be 3.6V. In addition, at step 400, the resistances of the second and fourth resistive elements $R_2$, $R_4$, which are variable, are set near the centre of their respective resistance ranges.

At step 405, the quiescent current drawn by the amplifier 100, or by the cascode arrangement of the first and second transistors M1, M2, from a power supply is measured and compared with a target value of the quiescent current. Such a target value of the quiescent current may be near the centre of the typical operational range of currents acceptable for the first or second transistors M1, M2. In one example, the target value of the quiescent current may be 50 mA.

At step 410, the resistance of the fourth resistive element $R_4$ is adjusted, thereby adjusting the second constant $S_2$ of equation (2) and consequently the second bias voltage $V_{bias2}$, in order to adjust the quiescent current to its target value.

At step 415, the envelope voltage $V_{env}$ is increased to a value higher than the typical operation value set at step 400, for example near the top of the operational voltage range, or near the highest voltage to be supplied by the envelope tracking stage 18. In one example this higher value may be in the range 4V to 5V. This action will result in an increase in the second bias voltage $V_{bias2}$, and so, also at step 415, the second bias voltage $V_{bias2}$ is measured again.

At step 420, if the second bias voltage $V_{bias2}$ measured at step 415 is unacceptably high for the first or second transistors M1, M2, the fourth resistive element $R_4$ is re-adjusted to reduce the second bias voltage $V_{bias2}$ to an acceptable value. This action determines the final resistance of the fourth resistive element $R_4$.

At step 425, the resistance, or setting, of the fourth resistive element $R_4$ is recorded. This value, in conjunction with the resistance of the third resistive element $R_3$, determines the final value of the second constant $S_2$ in equation (2). This recorded resistance, or setting, can be employed subsequently for the fourth resistive element $R_4$ when amplifying the input signal $V_i$.

At step 430, the envelope signal $V_{env}$ is reset to the typical voltage set at step 400, and at step 435, the quiescent current drawn by the amplifier 100, or by the cascode arrangement of the first and second transistors M1, M2, from a power supply is measured and compared with the target value of the quiescent current, as in step 405.

The re-adjustment of the fourth resistive element $R_4$ at step 420 may have affected the quiescent current, and so at step 440, the resistance of the second resistive element $R_2$ is adjusted, thereby adjusting the first constant $S_1$ of equation (1) and consequently the first bias voltage $V_{bias1}$, in order to restore the quiescent current to its target value.

At step 445, the envelope voltage $V_{env}$ is decreased to a value lower than the typical operation value set at step 400, for example near the bottom of the operational voltage range, or near the lowest voltage to be supplied by the envelope tracking stage 18. In one example this lower value may be 1.8V. This action will result in a reduction in the quiescent current, and so at step 450 the resistance of the second resistive element $R_2$ is re-adjusted to restore the quiescent current to its target value. This action determines the final resistance of the second resistive element $R_2$.

At step 455, the resistance, or setting, of the second resistive element $R_2$ is recorded. This value, in conjunction with the resistance of the first resistive element $R_1$, determines the final value of the first constant $S_1$ in equation (1). This recorded resistance, or setting, can be employed subsequently for the second resistive element $R_2$ when amplifying the input signal.

Figure 16:
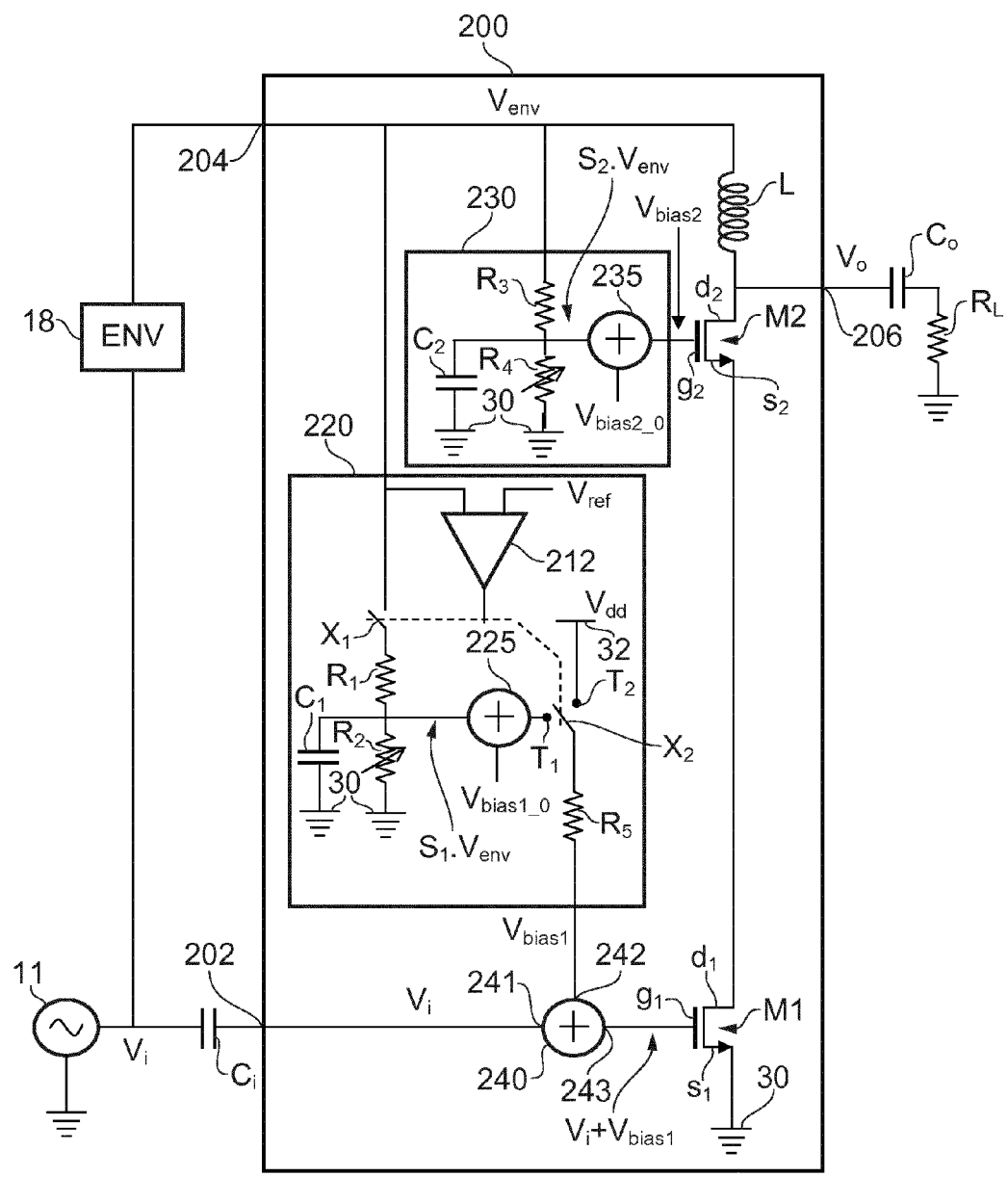
FIG. 16 is a second embodiment of an amplifier in accordance with the present disclosure.

Referring to FIG. 16, an amplifier 200 has an input port 202 for receiving an input signal $V_i$, an envelope port 204 for receiving an envelope signal $V_{env}$ indicative of an envelope of the input signal $V_i$, and an output port 206 for delivering an amplified signal $V_o$. The input port 202 is coupled to a signal source 11, which delivers the input signal $V_i$, by means of an input coupling capacitor $C_i$. The envelope port 204 is coupled to the signal source 11 by means of an envelope tracking stage 18. The envelope tracking stage 18 receives the input signal $V_i$ from the signal source 11 and generates the envelope signal $V_{env}$, which it delivers to the envelope port 204. The output port 206 is coupled to a load $R_L$ by means of an output coupling capacitor $C_o$.

The amplifier 200 has a first transistor M1 and a second transistor M2. A drain $d_1$ of the first transistor M1 is coupled to a source $s_2$ of the second transistor M2, the first and second transistors M1, M2 being coupled in a cascode configuration, with the first transistor M1 in a common source configuration and the second transistor M2 in a common gate configuration. A gate $g_1$ of the first transistor M1 is coupled to an output 243 of a first summing stage 240, and a drain $d_2$ of the second transistor M2 is coupled to the output port 206. A source $s_1$ of the first transistor M1 is coupled to a first voltage supply rail 30, which may be ground. An inductive element L is coupled between the envelope port 204 and the drain $d_2$ of the second transistor M2, for applying the envelope signal $V_{env}$ to the cascode arrangement of the first and second transistors M1, M2. The first summing stage 240 has a first input 241 coupled to the input port 202 for receiving the input signal $V_i$, a second input 242 for receiving a first bias voltage Vbias1, and the output 243 of the first summing stage 240 delivers a sum of the input signal $V_i$ and the first bias voltage $V_{bias1}$.

A first biasing circuit 220 is coupled between the envelope port 204 and the second input 242 of the first summing stage 240, and generates a first bias voltage $V_{bias1}$. The first bias voltage $V_{bias1}$ is dependent on the envelope signal $V_{env}$, when the envelope signal $V_{env}$ is less than a reference voltage $V_{ref}$, and has a constant value $V_{dd}$ when the envelope signal $V_{env}$ is greater than the reference voltage $V_{ref}$. In particular, the first biasing circuit 220 may comprise a first resistive element $R_1$ and a second resistive element $R_2$ coupled in series between a first terminal of a first switch $X_1$ and the first voltage rail 30. A second terminal of the first switch $X_1$ is coupled to the envelope port 204. Therefore, the first and second resistive elements $R_1$, $R_2$ form a first voltage divider providing, when the first switch $X_1$ is closed, that is, provides a short circuit, a first divided envelope signal $S_1 \cdot V_{env}$ by dividing the envelope signal $V_{env}$ present at the envelope port 204, and delivers the first divided envelope signal $S_1 \cdot V_{env}$ at a junction between the first and second resistive elements $R_1$, $R_2$. The junction between the first and second resistive elements $R_1$, $R_2$ is coupled to a first terminal $T_1$ of a second switch $X_2$ by means of a second summing stage 225 which adds a first quiescent bias voltage $Vbias_{1\_0}$ to the first divided envelope signal $S_1 \cdot V_{env}$. When the second switch $X_2$ is in a first switch position, an output of the second summing stage 225 is coupled to the second input 242 of the first summing stage 240 by means of a fifth resistive element $R_5$, in which case the first bias voltage $V_{bias1}$ is the sum of the first divided envelope signal $S_1 \cdot V_{env}$ and the first quiescent bias voltage $V_{bias1\_0}$. When the second switch $X_2$ is in a second switch position, the second summing stage 225 is decoupled from the second input 242 of the first summing stage 240, and instead the second switch $X_2$ couples a second voltage rail 32, having a constant voltage $V_{dd}$ and coupled to a second terminal $T_2$ of the second switch $X_2$, to the second input 242 of the summing stage 240 by means of the fifth resistive element $R_5$. A comparator 212 has a first input coupled to the envelope port 204 and a second input coupled to the reference voltage $V_{ref}$. An output of the comparator 212 is coupled to control the first and second switches $X_1$, $X_2$ such that, when the envelope signal $V_{env}$ is less than the reference voltage $V_{ref}$, the first switch $X_1$ is closed and the second switch $X_2$ is in the first switch position. In this state, the first bias voltage $V_{bias1}$ is dependent on the envelope signal $V_{env}$. When the envelope signal $V_{env}$ is greater than the reference voltage $V_{ref}$, the output of the comparator 212 causes the first switch $X_1$ to open, thereby decoupling the first voltage divider, consisting of the first and second resistive elements $R_1$, $R_2$, from the envelope port 204 and preventing any current drain through the first voltage divider, and the second switch $X_2$ to adopt the second switch position. In this state, the first bias voltage $V_{bias1}$ delivered to the second input 242 of the summing stage 240 by the first biasing circuit 220 is constant, being at the voltage $V_{dd}$ of the second voltage rail 32, and therefore independent on the envelope signal $V_{env}$. The first, or alternatively or additionally the second, resistive element $R_1$, $R_2$ has a variable resistance whose value may be selected by calibration as described below.

A second biasing circuit 230 is coupled between the envelope port 204 and the gate $g_2$ of the second transistor M2, and generates a second bias voltage $V_{bias2}$ dependent on the envelope signal $V_{env}$, and provides the second bias voltage $V_{bias2}$ to the gate $g_2$ of the second transistor M2. In particular, the second biasing circuit 230 may comprise a third resistive element $R_3$ and a fourth resistive element $R_4$ coupled in series between the envelope port 204 and the first voltage rail 30 thereby forming a second voltage divider providing, at a junction between the third and fourth resistive elements $R_3$, $R_4$, a second divided envelope signal $S_2 \cdot V_{env}$, where $S_2$ is a second constant less than unity. A third summing stage 235 is coupled to the junction between the third and fourth resistive elements $R_3$, $R_4$ and adds a second quiescent bias voltage $V_{bias2\_0}$ to the second divided envelope signal $S_2 \cdot V_{env}$, thereby forming the second bias voltage $V_{bias2}$ which is delivered to the gate $g_2$ of the second transistor M2. The fourth, or alternatively or additionally the third, resistive element $R_4$, $R_3$ has a variable resistance whose value may be selected by calibration as described below.

The first and second bias voltages $V_{bias1}$, $V_{bias2}$ are, when the envelope signal $V_{env}$ is less than the reference voltage $V_{ref}$, therefore dependent on the envelope signal $V_{env}$, both tracking the envelope signal $V_{env}$, and therefore both tracking each other. In particular, in this circumstance, the first and second bias voltages $V_{bias1}$, $V_{bias2}$ are related to the envelope signal $V_{env}$ by an affine function. As in the case of the amplifier 100 described with respect to FIG. 6, the dependence of the first and second bias voltages $V_{bias1}$, $V_{bias2}$ on the envelope signal $V_{env}$ may be expressed generally by, respectively, equations (1) and (2). When the envelope signal $V_{env}$ exceeds the reference voltage $V_{ref}$, only the second bias voltage $V_{bias2}$ is dependent on the envelope signal $V_{env}$, and tracks the envelope signal $V_{env}$, and the first bias voltage $V_{bias1}$ is constant. This embodiment of FIG. 16 can be used in circumstances where, when the envelope signal $V_{env}$ is greater than the reference voltage $V_{ref}$, the tracking of the envelope signal $V_{env}$ by only the second bias voltage $V_{bias2}$ provides a sufficiently constant gain, with the tracking of the envelope signal $V_{env}$ by also the first bias voltage $V_{bias2}$ being added only when the envelope signal $V_{env}$ is less than the reference voltage $V_{ref}$ to prevent the gain decreasing too much.

The amplifier 200 has a first capacitive element $C_1$ coupled between the first voltage rail 30 and the junction of the first and second resistive elements $R_1$, $R_2$. Likewise, there is a second capacitive element $C_2$ coupled between the first voltage rail 30 and the junction of the third and fourth resistive elements $R_3$, $R_4$. The capacitance of the first capacitive element $C_1$ and the capacitance of the second capacitive element $C_2$ are chosen to provide low impedance to the input signal $V_i$ and to the envelope signal $V_{env}$.

Calibration of the amplifier 200 may be performed using the calibration scheme described above with reference to FIG. 15, with an additional step to select the reference voltage $V_{ref}$.

Figure 17:
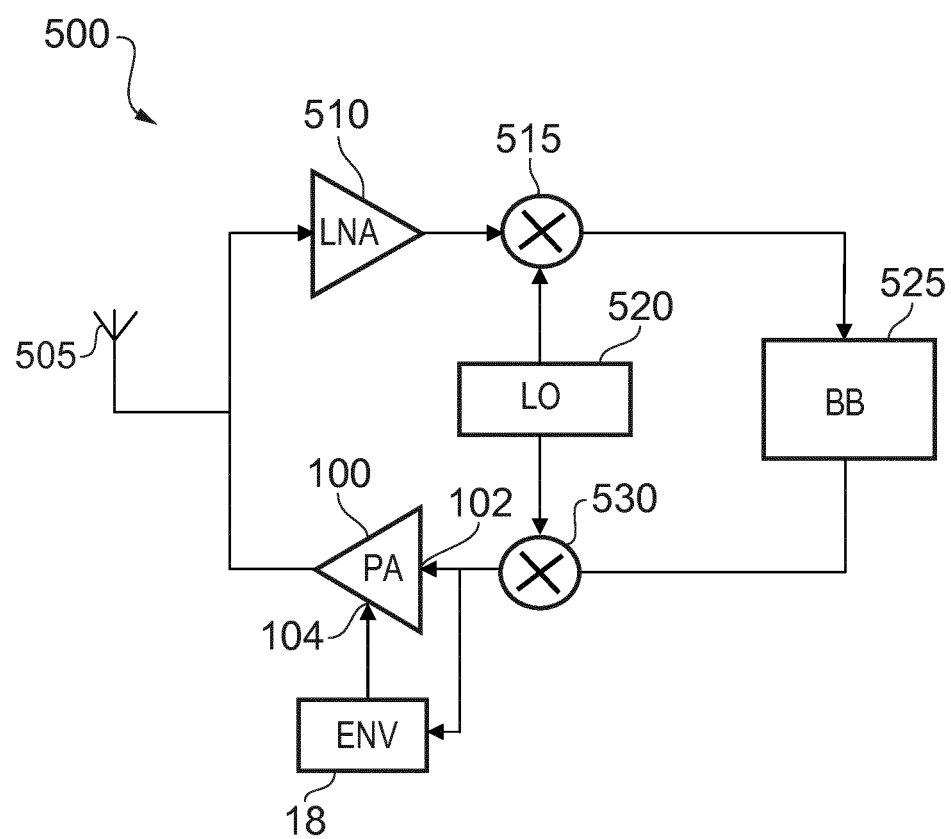
FIG. 17 is a block schematic diagram of an electronic apparatus comprising an amplifier.

Referring to FIG. 17, there is illustrated an electronic apparatus 500 comprising the amplifier 100, although the amplifier 200 may alternatively be employed. In this example, the electronic apparatus 500 is a wireless communication device such as a mobile phone. An antenna 505, for receiving an RF signal is coupled to an input of a low noise amplifier (LNA) 510 for amplifying the RF signal received by the antenna 505. An output of the LNA 510 is coupled to a down-conversion stage 515 for down-converting the RF signal to baseband signals by mixing the RF signal with a local oscillator signal supplied to the down-conversion stage 515 by a local oscillator 520. An output of the down-conversion stage 515 is coupled to a baseband processing stage (BB) 525 for demodulating and decoding the baseband signal. The BB 525 is coupled to an up-conversion stage 530 for up-converting to RF a baseband signal to be transmitted, by mixing the baseband signal with a local oscillator signal supplied to the up-conversion stage 530 by the local oscillator 520. An output of the up-conversion stage 530 is coupled to an input 102 of the amplifier 100, which may be a power amplifier (PA), to deliver the RF signal after up-conversion as an input signal $V_i$ to the amplifier 100. The output of the up-conversion stage 530 is also coupled to an envelope tracking stage 18 for generating the envelope signal $V_{env}$. An output of the envelope tracking stage 18 is coupled to an envelope input 104 of the amplifier 100 for delivering the envelope signal $V_{env}$. An output of the amplifier 100 is coupled to the antenna 505 for emitting the amplified RF signal.

In the amplifier 100 described with reference to FIG. 6 and the amplifier 200 described with reference to FIG. 16, each of the first, second and third summing stages 140, 240, 125, 225, 135, 235 may be implemented as, for example, a plurality of resistive elements coupled to a common node.

Although embodiments have been described in which the envelope tracking stage 18 is external to the amplifier 100, alternatively the amplifier 100 or amplifier 200 may comprise the envelope tracking stage 18. Likewise, the method of amplification may comprise generating the envelope signal $V_{env}$ from the input signal $V_i$. In some embodiments, the envelope tracking stage 18 may be arranged to generate the envelope signal $V_{env}$ quantised to have fewer values than the envelope of the input signal $V_i$. Likewise, the method of amplification may comprise generating the envelope signal $V_{env}$ quantised to have fewer values than the input signal $V_i$.

Although embodiments have been described which the transistors are NMOS transistors, alternatively PMOS transistors may be used.

Although embodiments have been described with reference to an input signal $V_i$ that is at a radio frequency, the disclosure is also applicable at other frequencies.

Although embodiments have been described in which two transistors are coupled in a cascode arrangement, the disclosure is not limited to two transistors, and more than two transistor may be coupled in a cascode arrangement, and the gate of each transistor provided with a bias voltage dependent on the envelope signal $V_{env}$.

Other variations and modifications will be apparent to the skilled person. Such variations and modifications may involve equivalent and other features which are already known and which may be used instead of, or in addition to, features described herein.

Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:
1. An amplifier comprising:
an input port for receiving an input signal;
an envelope port for receiving an envelope signal indicative of an envelope of the input signal;

an output port for delivering an amplified signal;
a first transistor and a second transistor, wherein a drain of the first transistor is coupled to a source of the second transistor, and a drain of the second transistor is coupled to the output port;
an inductive element coupled between the envelope port and the drain of the second transistor;
a first biasing circuit coupled to the envelope port and configured to generate a first bias voltage dependent on the envelope signal;
a summing stage coupled to the input port for receiving the input signal, coupled to the first biasing circuit for receiving the first bias voltage, coupled to a gate of the first transistor, and configured to deliver a sum of the input signal and the first bias voltage to the gate of the first transistor;
a second biasing circuit coupled between the envelope port and a gate of the second transistor, and configured to generate a second bias voltage dependent on the envelope signal and to deliver the second bias voltage to the gate of the second transistor,
wherein the first bias voltage is dependent on the envelope signal for a range of values of the envelope signal, and is independent of the envelope signal outside of the range of values of the envelope signal.

2. The amplifier of claim 1, wherein the range of values of the envelope signal for which the first bias voltage is dependent on the envelope signal corresponds to the envelope signal being less than a threshold, the first bias voltage being constant when the envelope signal is greater than the threshold.

3. The amplifier of claim 1, wherein the first and second bias voltages dependent on the envelope signal are each an affine function of the envelope signal.

4. The amplifier of claim 1, wherein the first bias voltage, $V_{bias1}$, dependent on the envelope signal is related to the envelope signal by $V_{bias1}=S_1 \cdot V_{env}+V_{bias1\_0}$, and wherein the second bias voltage, $V_{bias2}$, is related to the envelope signal by $V_{bias2}=S_2 \cdot V_{env}+V_{bias2\_0}$, where $V_{env}$ is the envelope signal, $S_1$ is a first constant, $V_{bias1\_0}$ is a first quiescent voltage, $S_2$ is a second constant and $V_{bias2\_0}$ is a second quiescent voltage.

5. The amplifier of claim 4, wherein the first biasing circuit comprises a first voltage divider configured to generate a first divided envelope signal $S_i \cdot V_{env}$ by dividing the envelope signal, and the second biasing circuit comprises a second voltage divider configured to generate a second divided envelope signal $S_2 \cdot V_{env}$ by dividing the envelope signal.

6. The amplifier of claim 5, wherein the first voltage divider comprises a first resistive element having a variable resistance for establishing the first constant, and wherein the second voltage divider comprises a second resistive element having a variable resistance for establishing the second constant.

7. The amplifier of claim 4, wherein the first and second biasing circuits are configured to generate the first and second bias voltages by providing values for the first and second quiescent voltages and the first and second constants, such that, if the input signal is absent, a current drawn by the amplifier varies by less than 10% in response to a variation of the envelope signal across a maximum operating range of the amplifier.

8. The amplifier of claim 1, further comprising an envelope tracking stage configured to generate the envelope signal in response to the input signal.

9. The amplifier of 8, wherein the envelope tracking stage is configured to generate the envelope signal quantized to have fewer values than the envelope of the input signal.

10. A method of amplification, comprising:
providing a first transistor and a second transistor, wherein a drain of the first transistor is coupled to a source of the second transistor and a drain of the second transistor is coupled to an output port;
providing an inductive element coupled between an envelope port and the drain of the second transistor;
receiving an input signal;
receiving at the envelope port an envelope signal indicative of an envelope of the input signal;
generating a first bias dependent on the envelope signal;
delivering a sum of the first bias voltage and the input signal to a gate of the first transistor;
generating a second bias voltage dependent on the envelope signal, and delivering the second bias voltage to a gate of the second transistor; and
delivering an amplified signal at the output port,
wherein the first bias voltage is dependent on the envelope signal for a range of values of the envelope signal, and is independent of the envelope signal outside of the range of values of the envelope signal.

11. The method of amplification of claim 10, wherein the range of values of the envelope signal for which the first bias voltage is dependent on the envelope signal corresponds to the envelope signal being less than a threshold, and wherein the first bias voltage is constant when the envelope signal is greater than the threshold.

12. The method of amplification of claim 10, wherein the first bias voltage, $V_{bias1}$, dependent on the envelope signal is related to the envelope signal by $V_{bias1}=S_1 \cdot V_{env}+V_{bias1\_0}$, and wherein the second bias voltage, $V_{bias2}$, is related to the envelope signal by $V_{bias2}=S_2 \cdot V_{env}+V_{bias2\_0}$, where $V_{env}$ is the envelope signal, $S_1$ is a first constant, $V_{bias1\_0}$ is a first quiescent voltage, $S_2$ is a second constant and $V_{bias2\_0}$ is a second quiescent voltage.

13. The method of claim 10, further comprising:
calibrating at least one of a first bias voltage circuit and a second bias voltage circuit configured to provide the first and the second bias voltage, respectively, to achieve a target value of a quiescent current.

14. The method of claim 13, wherein the first bias voltage circuit or the second bias circuit is calibrated by varying a variable resistance of a voltage divider included in the first or the second bias circuit that is calibrated.

15. The method of claim 13, wherein both the first bias voltage circuit and the second bias circuit are calibrated.

16. The method of claim 15, wherein the second bias circuit is calibrated after calibrating the first bias circuit.

17. An amplifier comprising:
an input port for receiving an input signal;
an envelope port for receiving an envelope signal indicative of an envelope of the input signal;
an output port for delivering an amplified signal;
a first transistor and a second transistor, wherein a drain of the first transistor is coupled to a source of the second transistor, and a drain of the second transistor is coupled to the output port;
an inductive element coupled between the envelope port and the drain of the second transistor;
a first biasing circuit coupled to the envelope port and configured to generate a first bias voltage dependent on the envelope signal;
a summing stage coupled to the input port for receiving the input signal, coupled to the first biasing circuit for receiving the first bias voltage, coupled to a gate of the first transistor, and configured to deliver a sum of the input signal and the first bias voltage to the gate of the first transistor;

a second biasing circuit coupled between the envelope port and a gate of the second transistor, and configured to generate a second bias voltage dependent on the envelope signal and to deliver the second bias voltage to the gate of the second transistor, wherein the first bias voltage, $V_{bias1}$, dependent on the envelope signal is related to the envelope signal by $V_{bias1} = S_t V_{env} + V_{bias1\_0}$, and wherein the second bias voltage, $V_{bias2}$, is related to the envelope signal by $V_{bias2} = S_2 \cdot V_{env} + V_{bias1\_0}$, where $V_{env}$ is the envelope signal, $S_1$ is a first constant, $V_{bias1\_0}$ is a first quiescent voltage, $S_2$ is a second constant and $V_{bias1\_0}$ is a second quiescent voltage, and the first and second biasing circuits are configured to generate the first and second bias voltages by providing values for the first and second quiescent voltages and the first and second constants, such that, if the input signal is absent, a current drawn by the amplifier varies by less than 10% in response to a variation of the envelope signal across a maximum operating range of the amplifier.

\* \* \* \* \*

UNITED STATES PATENT AND TRADEMARK OFFICE
CERTIFICATE OF CORRECTION

PATENT NO. : 9,602,059 B2
APPLICATION NO. : 14/769126
DATED : March 21, 2017
INVENTOR(S) : Vincent Knopik It is certified that error appears in the above-identified patent and that said Letters Patent is hereby corrected as shown below:

In the Specification

In Column 3, Line 28, delete "$S_2. V_{enc}$" and insert -- $S_2. V_{env}$ --, therefor.

In Column 6, Line 15, delete "Vbias1," and insert -- $V_{bias1}$, --, therefor.

In Column 7, Line 22, delete "$S_2R_4/(R_3+R_4),$" and insert -- $S_2 = R_4/(R_3+R_4)$, --, therefor.

In Column 12, Line 3, delete "Vbias1," and insert -- $V_{bias1}$, --, therefor.

In Column 13, Line 49, delete "$V_{enc}.$" and insert -- $V_{env}.$ --, therefor.

In the Claims

In Column 15, Line 46, in Claim 5, delete "$S_i. V_{env}$" and insert -- $S_1. V_{env}$ --, therefor.

In Column 17, Line 13, in Claim 17, delete "$V_{bias1}=S_t V_{env}+V_{bias1\_0},$" and insert -- $V_{bias1}=S_1. V_{env}+V_{bias1\_0},$ --, therefor.

In Column 17, Line 15, in Claim 17, delete "$V_{bias2}=S_2. V_{env}+V_{bias1\_0},$" and insert -- $V_{bias2}=S_2. V_{env}+V_{bias2\_0},$ --, therefor.

In Column 17, Line 17, in Claim 17, delete "$V_{bias1\_0}$" and insert -- $V_{bias2\_0}$ --, therefor.

Signed and Sealed this
Twenty-fourth Day of December, 2019

Andrei Iancu
*Director of the United States Patent and Trademark Office*